(12) United States Patent
Akiyama

(10) Patent No.: US 6,440,504 B1
(45) Date of Patent: Aug. 27, 2002

(54) VACUUM PROCESSING APPARATUS AND VACUUM PROCESSING METHOD

(75) Inventor: Kazuyoshi Akiyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/986,577

(22) Filed: Dec. 5, 1997

(30) Foreign Application Priority Data

Dec. 12, 1996 (JP) .............................................. 8-352137

(51) Int. Cl.⁷ .............................. H05N 1/24; B05D 3/00; C23C 16/00
(52) U.S. Cl. ........................ 427/569; 427/578; 427/579; 427/294; 118/723 R; 118/723 E
(58) Field of Search .................... 118/723 E, 723 R, 118/715, 729, 723 I, 723 AN, 723 MW; 204/298.02, 298.31; 216/67–71; 156/345; 427/569–579, 294; 219/121.36–121.59

(56) References Cited

U.S. PATENT DOCUMENTS 5,076,205 A * 12/1991 Vowles et al. ............... 118/719
5,478,429 A * 12/1995 Komino et al. ............. 156/345
5,853,521 A * 12/1998 Chung et al. ................ 156/345

FOREIGN PATENT DOCUMENTS

JP 58-83855 5/1983
JP 62-219524 9/1987

* cited by examiner

Primary Examiner—Vivian Chen
(74) Attorney, Agent, or Firm—Fitzpatrick, Cella, Harper & Scinto

(57) ABSTRACT

The object of the present invention is to provide a deposited film forming apparatus and deposited film forming method that can efficiently, cheaply, and stably supply high-quality amorphous silicon devices. This object is achieved by providing a vacuum vessel capable of providing a substrate therein, evacuating the inside of the vacuum vessel by an evacuation means, introducing a gas from gas supply means into the vacuum vessel, and applying high-frequency power from a high-frequency power source, thereby generating a plasma, wherein the evacuation means comprises at least two evacuation means as first evacuation means and second evacuation means, wherein the vacuum vessel is moved while maintaining a vacuum between the two evacuation means, and wherein the vacuum vessel is capable of being connected to each of the evacuation means, high-frequency power source, and gas supply means through a detachable connection mechanism.

27 Claims, 6 Drawing Sheets

VACUUM PROCESSING APPARATUS AND VACUUM PROCESSING METHOD

BACKGROUND OF THE INVENTION

1. Field of the Invention

The present invention relates to a vacuum processing apparatus and vacuum processing methods typified by deposited film forming apparatus and deposited film forming methods using plasma enhanced CVD capable of forming on a substrate a deposited film. This invention relates more particularly to the formation of a functional deposited film, especially a non-monocrystalline semiconductor typified by amorphous semiconductors, an insulating coating such as silicon nitride, silicon carbide, or amorphous carbon, used in semiconductor devices, light-receiving members for electrophotography, line sensors for image input, image pickup devices, photovoltaic devices, and so on.

2. Related Background Art

Deposited films of semiconductors or the like made of amorphous materials such as amorphous silicon, for example, amorphous silicon compensated by hydrogen and/or halogen, have been proposed as element members for use in semiconductor devices, light-receiving members for electrophotography, line sensors for image input, image pickup devices, photovoltaic devices, other various electronics elements, and so on. Some of them are in practical use.

A variety of device forming apparatuses using amorphous silicon as described above have been proposed heretofore. For example, Japanese Patent Application Laid-open No. 58-83855 discloses a forming apparatus (of the coaxial type) for an amorphous silicon photosensitive member in which the cathode electrode and a cylindrical substrate are arranged on a coaxial basis. Further, Japanese Patent Application Laid-open No. 62-219524 discloses an example of a forming apparatus (of the concentric circle type) for an amorphous silicon photosensitive member with improved productivity, in which cylindrical substrates are arranged on one circle.

With recent improvements in overall performance of devices using amorphous silicon materials as described above, however, demands have increased for further improvement in the quality of the materials themselves, including various characteristics of amorphous silicon materials.

For example, in the field of electrophotography, there has been a strong push to save space and to lower prices in order to improve office environments.

On the other hand, demands have increased for further increase of copy image definition and for further increase of image formation speed. Under such circumstances demands for a decrease in the diameter of amorphous silicon photosensitive members and for commonality thereof have increased. At the same time, the tendency to specialize with respect to the diameters of photosensitive members also exists in order to make configurations optimum for characteristics of the electrophotographic process.

Under such circumstances, the conventional deposited film forming apparatus did not always meet the demands in some cases.

For example, in the case where an amorphous silicon photosensitive member for electrophotography was formed by the deposited film forming apparatus of the coaxial type as described above, changing the diameter of the photosensitive member also changed the diameter of a support member. It also resulted in changing the distance to the cathode and the like. This changed forming conditions of the deposited film, and in order to deal with the change, the apparatus needed to be modified, including the diameter of the cathode, change of evacuation position, and so on. Such modification normally required a period of several days.

In the case of the deposited film forming apparatus of the concentric circle type as described above, changing the diameter of the photosensitive member required changing the placement of substrates in order to form the discharge space. The modification usually required several days, too.

The dead time for the apparatus during modification caused degradation of operation rates of the starting material gas supply means and the evacuation system, thereby requiring big investments and other incidental facilities.

If photosensitive members of different diameters are intended to be produced by changing other deposition conditions without modifying the deposited film forming apparatus in order to avoid dead time, the apparatus configuration would deviate from the optimum shape. This would inevitably result in the occurrence of dispersion in the characteristics of the deposited film and the like or often requiring still more improvements for fully meeting recent, high desired performance demands.

The above problems occur not only in the case of formation of a deposited film, but also in the case of plasma processing of a surface to be processed. In such a case, it is considered important to optimize the configuration of the overall apparatus and its characteristics, due to variations in etch amount, modification amount, etc., though these variations are not as prominent as in the formation of deposited film.

SUMMARY OF THE INVENTION

An object of the present invention is, therefore, to provide a vacuum processing apparatus and vacuum processing method, typified by the deposited film forming apparatus and deposited film forming method, capable of efficiently, cheaply, and stably supplying non-monocrystalline semiconductor devices including high-quality amorphous silicon devices meeting the above demands and solving the above problems.

Another object of the present invention is to provide a vacuum processing apparatus and vacuum processing method capable of supplying non-monocrystalline semiconductor devices while suppressing dispersion of characteristics, by facilitating supply of desired gas such as starting material gas into a movable vacuum vessel, thus preventing the occurrence of leakage or the like, and stabilizing the supply of gas.

An object of the present invention is to provide a vacuum processing apparatus comprising a vacuum vessel capable of providing a substrate therein, the vacuum processing apparatus being arranged to evacuate the inside of the vacuum vessel by evacuation means, introduce a gas from gas supply means into the vacuum vessel, and apply high-frequency power from a high-frequency power source to electrodes, thereby generating a plasma, wherein the evacuation means comprises at least two evacuation means as first evacuation means and second evacuation means, wherein the vacuum vessel is moved between the two evacuation means while maintaining vacuum, and wherein the vacuum processing apparatus comprises a connection mechanism capable of detachably connecting the vacuum vessel to each of the evacuation means, high-frequency power source, and gas supply means.

Another object of the present invention is to provide the vacuum processing apparatus wherein the first evacuation means can be used as evacuation means for evacuating the vacuum vessel from atmospheric pressure to a vacuum and the second evacuation means can be used as evacuation means for evacuating the inside of the vacuum vessel during generation of the plasma.

A further object of the present invention is to provide the vacuum processing apparatus wherein in a connection part between the vacuum vessel and gas supply means, the connection mechanism has a double structure of a starting material gas supply pipe through which a starting material gas flows and an external pipe for separating a connection portion of the pipe for supply of starting material gas from the atmosphere and permitting evacuation to a vacuum. If necessary, this external pipe is constructed as a pipe for detachably connecting the vacuum vessel to the evacuation means.

Still another object of the present invention is to provide the vacuum processing apparatus wherein the connection portion of the gas supply pipe comprises valves capable of sealing the connection portion before and after the connection portion and a pressure gauge for measuring a pressure inside the gas supply pipe between the valves.

A further object of the present invention is to provide a vacuum processing method for evacuating the inside of a vacuum vessel provided with a substrate therein by evacuation means, introducing a gas into the vacuum vessel and applying high-frequency power thereto, thereby generating a plasma inside the vacuum vessel, wherein the evacuation means comprises at least two evacuation means as first evacuation means and second evacuation means, the vacuum processing method comprising the steps of: connecting the vacuum vessel to the first evacuation means to evacuate the vacuum vessel from atmospheric pressure to a vacuum, disengaging and moving the vacuum vessel from the first evacuation means while maintaining vacuum, connecting the vacuum vessel with each of gas supply means, the second evacuation means for evacuating the inside of the vacuum vessel, and a high-frequency power source, supplying energy from the power source to generate the plasma, and disconnecting the vacuum vessel from the second evacuation means, the gas supply means, and the high-frequency power source.

Another object of the present invention is to provide the vacuum processing method further comprising a step of, in connecting the vacuum vessel with the gas supply means, replacing the atmosphere inside of a gas supply pipe through which a gas flows with an inert gas, and thereafter measuring a seal pressure of a connection portion.

Another object of the present invention is to provide the vacuum processing method capable of, during generation of the plasma with the vacuum vessel being connected to the second evacuation means, gas supply means, and high-frequency power source, connecting another vacuum vessel to the first evacuation means and setting a substrate in or evacuating the other vacuum vessel.

In the vacuum processing apparatus of the present invention, achieving the above objects, the evacuation means is fixed, and the vacuum vessel is freely movable. Therefore, for example, when vacuum vessels preliminarily prepared to be suitable for the production of desired amorphous silicon devices are used, no modification is necessitated for the vacuum processing apparatus (deposited film forming apparatus in the case of formation of deposited film) even for the production of many kinds and small numbers of lots. In this way, the dead time of the producing apparatus can be minimized. Since optimum configurations can be selected for respective vacuum vessels suitable for production methods of respective individual amorphous silicon devices, high-quality devices can be provided on a stable basis.

Further, since the vacuum vessel is movable, when a plurality of vacuum vessels are used, one vacuum vessel can be subjected to maintenance at a position apart from the evacuation means, while formation of a deposited film can be carried out in another vacuum vessel.

Accordingly, the dead time of a deposited film forming apparatus can also be minimized from this point, and high-quality devices can be supplied at low prices.

The present invention is effective not only in the formation of deposited film, but also in applications to plasma processing such as etching or modification of a processed body by use of plasma (for example, compensation for dangling bonds by hydrogen plasma). However, when the present invention is applied to the formation of a deposited film, its most prominent effect is seen in the fabrication of devices of higher performance and higher quality. Thus, the application to the formation of a deposited film is a preferred application. Particularly, a preferred application is the fabrication of devices having a non-monocrystalline material such as amorphous silicon, especially fabrication of optical devices typified by the photosensitive members for electrophotography.

DETAILED DESCRIPTION OF THE PREFERRED EMBODIMENTS

The present invention will be described in detail by reference to the drawings.

Figure 1:
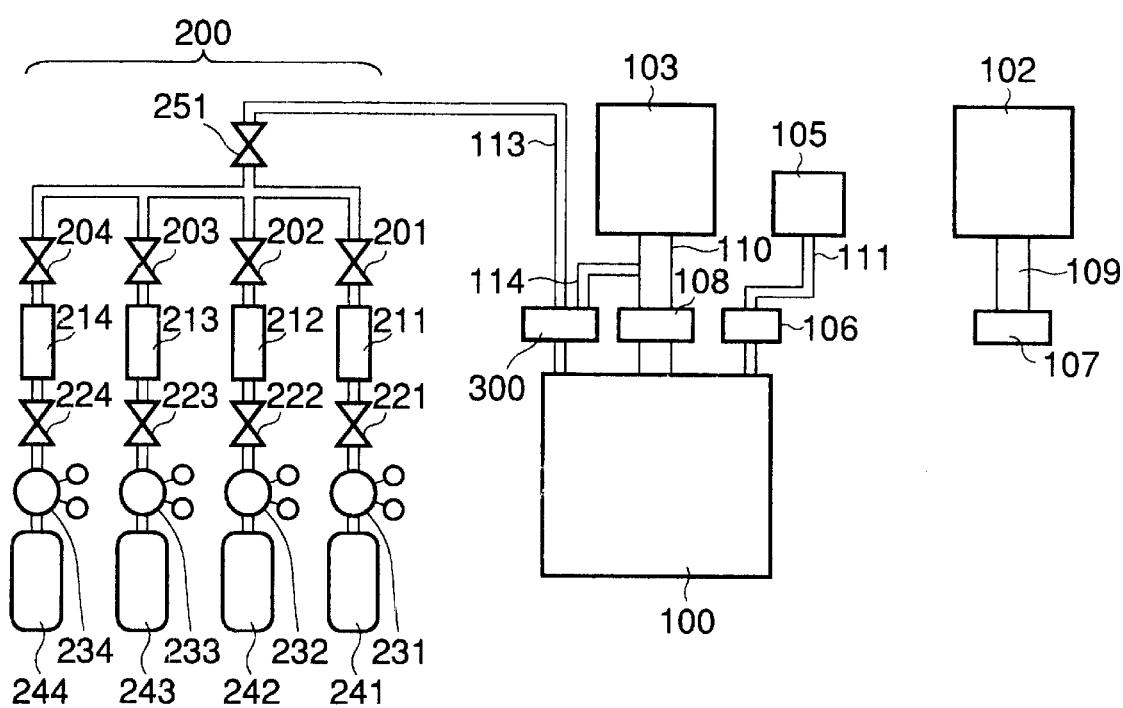
FIG. 1 is a schematic, structural drawing which shows a preferred example of the configuration of the vacuum processing apparatus according to the present invention.

FIG. 1 is a schematic, structural drawing which shows an example of the deposited film forming apparatus of the present invention.

This apparatus is mainly composed of vacuum vessel 100, starting material gas supply means 200, evacuation unit 102 as first evacuation means for evacuating the vacuum vessel 100 to a vacuum, evacuation unit 103 as second evacuation means for evacuating starting material gases from the vacuum vessel 100 during formation of deposited film, and high-frequency power source 105. The evacuation unit 102 is connected to connection mechanism 107 through evacuation pipe 109, and the second evacuation unit 103 is connected to connection mechanism 108 through vacuum pipe 110.

In FIG. 1, the starting material gas supply means 200 is connected to the vacuum vessel 100 through starting material gas supply pipe 113 and starting material gas connection mechanism 300. The starting material gas connection mechanism 300 is connected to evacuation pipe 114 branching off from the evacuation pipe 110, thereby enabling the evacuation of the inside of the starting material gas supply path. The high-frequency power source 105 is connected via high-frequency transmission circuit 111 and connection mechanism 106 to the vacuum vessel 100. The vacuum vessel 100 is arranged to be separated at the connection mechanisms 106, 108, 300 and to be moved freely, and it is capable of being also connected to the evacuation unit 102 through the connection mechanism 107.

The frequency of energy supplied from the high-frequency power source 105 may be any one of those used in ordinary plasma enhanced CVD, and it is selected preferably from so-called radio frequencies (the RF band) and the VHF band. A specific example of the frequency band applicable is the range of 10 MHz to 450 MHz. For supplying the energy into the vacuum apparatus, a part of the vacuum vessel may be used as an electrode or a separate electrode from the main body of the vacuum vessel may be provided.

Figure 2:
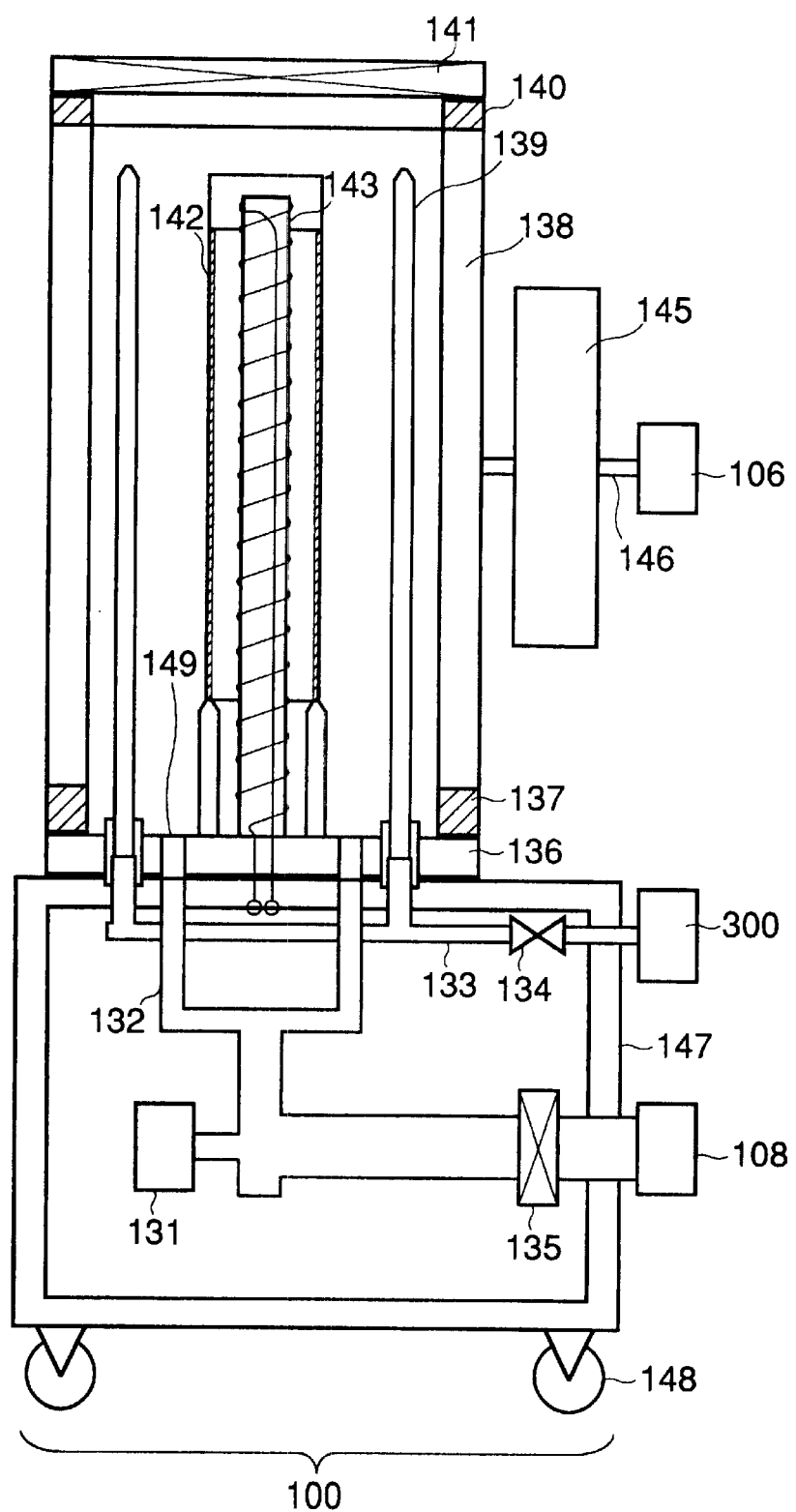
FIG. 2 is a schematic, cross-sectional, structural drawing which shows a preferred example of the vacuum vessel of the vacuum processing apparatus.

FIG. 2 is a schematic, cross-sectional view of an example of the vacuum vessel in the deposited film forming apparatus of the present invention for forming the amorphous silicon photosensitive member.

In the example of FIG. 2, the vacuum vessel 100 is constructed so that vacuum furnace 138 is placed on movable carriage 147.

Casters 148 are attached to the movable carriage 147, whereby the whole of vacuum vessel 100 is movable.

Matching box 145 is connected via high-frequency transmission circuit 146 to the vacuum furnace 138, thereby comprising high-frequency introducing means.

The high-frequency introducing means is further connected to connection mechanism 106 for connection to the high-frequency power source. In this case, the wall surface of vacuum furnace 138 also serves as the cathode electrode. This wall surface is configured in close fit with pedestal 136 and door 141 through insulators 137, 140 and is insulated from the earth.

Starting material gas supply pipes 139 and cylindrical, conductive substrate 142 are installed inside the vacuum furnace 138.

Heater 143 can be placed, if necessary, inside the cylindrical, conductive substrate.

The starting material gas supply pipes 139 penetrate the pedestal 136 to be connected to starting material gas introducing pipe 133 and further to valve 134, thereby comprising starting material gas introducing means.

The starting material gas introducing means is connected to connection mechanism 300 for connection with the starting material gas supply means. Exhaust ports 149 are formed in the pedestal 136 and are connected to evacuation pipe 132.

Vacuum gauge 131 and valve 135 are connected to the evacuation pipe 132 to be further connected with connection mechanism 108 for connection to the evacuation unit.

The vacuum vessel 100 can be moved while maintaining vacuum by closing the door 141 and valves 134 and 135.

Figure 3:
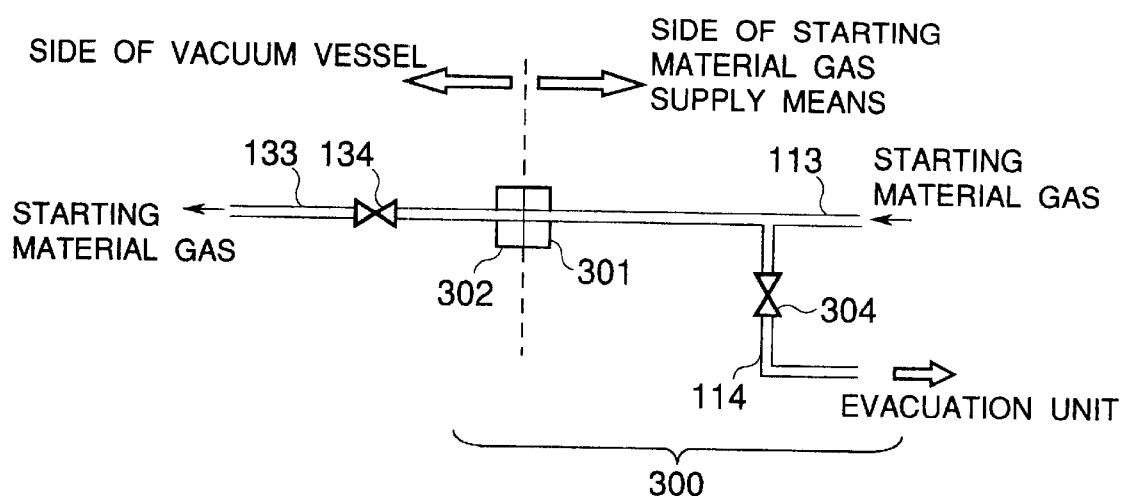
FIGS. 3, 4, 5 and 6 are schematic, structural drawings, each of which explains a preferred example of the connection mechanism used in the present invention.

FIG. 3 is a schematic, structural drawing of an example of the connection mechanism for connecting the starting material gas introducing means with the starting material gas supply means in the deposited film forming apparatus of the present invention.

In the example of FIG. 3, the starting material gas supply pipe 113 and starting material gas introduction pipe 133 are connected by couplers 302, 301 capable of being engaged or disengaged. Evacuation pipe 114 connected through valve 304 enables the evacuation of the inside of starting material gas supply pipe 113.

The evacuation pipe 114 may be configured to be connected to the evacuation pipe 110 so as to be evacuated by the second evacuation unit as shown in FIG. 1 or may also be configured to be evacuated by a separate evacuation unit.

Next described is an example of procedures for forming a deposited film by use of the apparatus shown in FIGS. 1 to 3.

First, the vacuum vessel 100 in which the high-frequency introducing means and starting material gas introducing means were preliminarily set is connected through the connection mechanism 107 to the evacuation pipe 109 and evacuation unit 102.

Then the cylindrical, conductive substrate having been degreased is set in the vacuum vessel 100. Here, the door 141 provided in the top part of vacuum furnace 138 and the valve 134 are closed, and the valve 135 and an evacuation valve (not illustrated) provided in the connection mechanism 108 are opened to evacuate the inside of vacuum furnace 138 to a vacuum. Observing the indication of vacuum gauge 131, the valve 135 and the evacuation valve (not illustrated) provided in the connection mechanism 108 are closed at a desired pressure, and then the connection mechanism 108 is disconnected to detach the vacuum vessel 100 from the evacuation unit 102 while maintaining vacuum inside the vacuum vessel 100.

Then the vacuum vessel 100 is moved to the predetermined position, where it is connected with the starting material gas supply means 200, evacuation unit 103, and high-frequency power source 105 through the connection mechanisms 300, 108, and 106, respectively.

The following is an example of procedures for introduction of starting material gas by use of the connection mechanism shown in FIG. 3.

First, after connection of each connection mechanism is confirmed, the evacuation valve (not illustrated) provided in the connection mechanism 108 is opened to evacuate the inside of connection mechanism 108.

In tandem with this, the valve 304 provided in the connection mechanism 300 is opened to evacuate the inside of starting material gas supply pipe 113. After sufficient evacuation, the valve 304 is closed, then the inert gas such as Ar or He is introduced from the starting material gas supply means 200 into the starting material gas supply pipe 113 to fill the inside of pipe 113 up to before the valve 134, and then the valve 304 is again opened to evacuate the inside.

This operation is repeated several times to sufficiently purge the inside of starting material gas supply pipe 113. After that, the valve 304 is closed, and, while keeping the inside of starting material gas supply pipe 113 under pressure with the inert gas, for example, a gas leak detection liquid is applied to the coupler portion to check whether a leak is present. If no leak is observed, the valve 304 is opened to again evacuate the inside of starting material gas supply pipe 113, and then starting material gas, for example, $SiH_4$, $CH_4$, or $B_2H_6$, is introduced thereinto.

The above completes the procedures for introducing the starting material gas to the inside of starting material gas supply pipe 113. Then the valve 135 is opened to evacuate the inside of vacuum vessel 100.

Checking the indication of vacuum gauge 131, it is confirmed whether the pressure inside the vacuum vessel is lowered to below desired pressure, and after confirmation, the valve 134 is opened to introduce the starting material gas.

At this time, the starting material gas, for example $SiH_4$, $CH_4$, or $B_2H_6$, is introduced while suppressing pressure change by a needle valve (not illustrated) provided separate from the valve 134. The starting material gas is supplied from cylinder 241 to 244 through regulator 231 to 234, primary valve 221 to 224, mass flow controller 211 to 214, and secondary valve 201 to 204 and through the valve 251 to the starting material gas supply pipe.

After the starting material gas is supplied at desired flow rates into the vacuum vessel 100 and the inside of vacuum vessel 100 is adjusted to desired pressure by a pressure adjusting valve (not illustrated), the high-frequency power is supplied from the high-frequency power source 105 to induce glow discharge therein, thereby forming a deposited film on the substrate 142.

Prior to this, the heater 143 provided in the vacuum vessel may also be connected to the power source, if necessary, thereby heating the substrate to a desired temperature between 20° C. and 500° C.

In this case, the substrate can also be heated while introducing the inert gas such as Ar or He from the starting material gas supply means.

After the desired deposited film is formed, supply of the starting material gas and high-frequency power is stopped and then the inside of starting material gas supply pipe 113 is purged according to the same procedures as described previously.

When the sufficient purge operation is completed, the evacuation valve (not illustrated) provided in the connection mechanism 108 is closed, the connection mechanisms 106, 108, 300 are disengaged, and the vacuum vessel 100 is detached from the respective units to be moved.

The deposited film formed is cooled if necessary, and thereafter the vacuum vessel 100 is made to leak by a leak mechanism (not illustrated). Then the substrate 142 is taken out, thereby completing the sequence of procedures for forming the deposited film.

The deposited film forming apparatus of the present invention can increase productivity, because the vacuum vessel can be moved while maintaining vacuum.

For example, during formation of a deposited film with one vacuum vessel being connected to the starting material gas supply mechanism, high-frequency power source, and evacuation unit, installation of a conductive substrate and evacuation to vacuum can be carried out with another vacuum vessel being connected to the first evacuation means.

With the deposited film forming apparatus of the present invention, as described above, even if one vacuum vessel is, for example, being maintained or modified formation of deposited film can be carried out with another vacuum vessel; therefore, there should be no decrease in the operation rates of the starting material gas supply means, evacuation means, and high-frequency power source, thereby obviating big investments and other incidental facilities and enabling the supply of cheap amorphous silicon devices.

For forming amorphous silicon photosensitive members of different diameters or the like, vacuum vessels of configurations optimum for the respective diameters are preliminarily prepared. In this way the problems of the conventional apparatus are not raised, including the decrease of operation rates due to modification of apparatus, occurrence of dispersion of characteristics due to use of the vacuum vessel deviating from the optimum configuration, and so on.

In the deposited film forming apparatus according to the present invention, the connection mechanism 300 between the vacuum vessel and the starting material gas supply means can be constructed in double structure.

Figure 4:
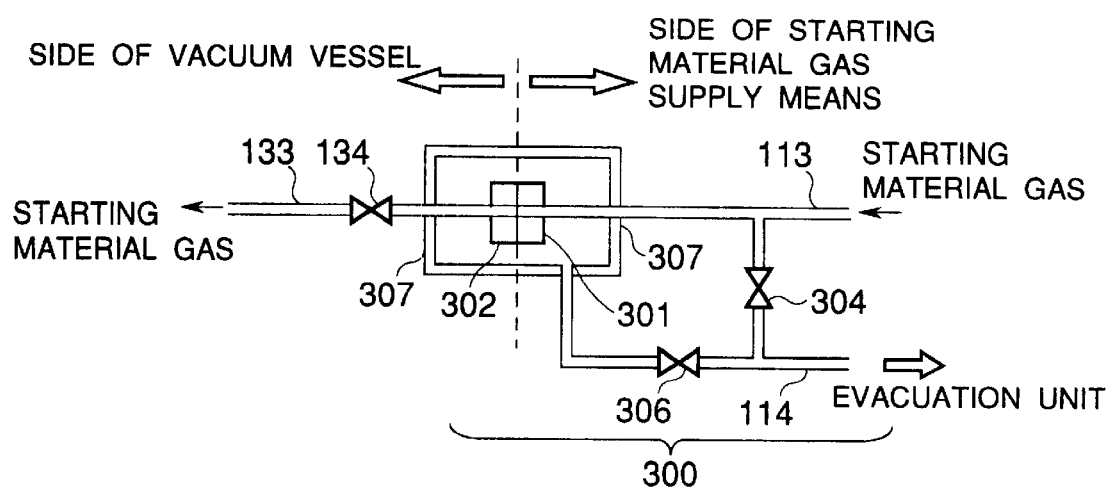

FIG. 4 is a schematic, structural drawing schematically showing an example of the connection mechanism constructed in the double pipe structure.

In FIG. 4 the couplers 301, 302 are covered by external pipe 307 so as to be separated from the atmosphere.

The external pipe has such structure that it can be disengaged at the dotted-line portion of FIG. 4 into the vacuum vessel side and the starting material gas supply means side. Together with the starting material gas supply pipe, it is connected by a clamp (not illustrated) and a vacuum seal (not illustrated), and it can be evacuated to a vacuum while the evacuation pipe 114 is connected thereto through valve 306.

The procedures for introduction of starting material gas by use of the introducing mechanism of FIG. 4 may include a procedure for evacuating the inside of external pipe 307 to a vacuum, in addition to the procedures of the above-stated introducing mechanism of FIG. 3.

Specifically, in connecting the vacuum vessel with the starting material gas supply means, the couplers 301, 302 are first connected.

Then the valve 304 is opened to evacuate the inside of starting material gas supply pipe 113 to a vacuum. After completion of sufficient evacuation, the valve 304 is closed, and the inert gas such as Ar or He is introduced up to before the valve 134 from the starting material gas supply unit 200 into the starting material gas supply pipe 113. Then the valve 304 is again opened to evacuate the inside.

This operation is repeated several times to perform the purge operation, and during this period the valve 306 is closed.

After execution of sufficient purge, the valve 304 is closed, and, for example, the gas leak detection liquid is applied to the coupler portion with the inside of starting material gas supply pipe 113 being maintained under pressure with the inert gas, thereby checking a leak.

After no leak is confirmed, the valve 304 is opened to again evacuate the starting material gas introducing pipe 113. Then the valve 304 is closed, and the starting material gas is introduced into the starting material gas introducing pipe 113.

In tandem with this, the external pipe 307 is attached to the couplers 301, 302. After completion of evacuation of starting material gas introducing pipe 113 and at the time of close of valve 304, the valve 306 is opened to evacuate the inside of external pipe 307.

The above concludes the introduction of starting material gas, and then the formation of deposited film is carried out. Desirably, the valve 306 is opened during the formation of deposited film to continue evacuation of the inside of external pipe 307. For disengaging the connection mechanism after formation of deposited film, the valve 306 is closed and thereafter the valve 304 is opened to purge the inside of starting material gas supply pipe 113 and to replace the inside with the inert gas. Then the inside of the external pipe 307 is made to leak by the leak mechanism (not illustrated), and the connection mechanism 300 is disengaged.

When the connection mechanism as shown in FIG. 4 is used, the starting material gas can be prevented from directly being discharged into the atmosphere even if the starting material gas leaks from the couplers 301, 302.

There are cases where the starting material gas supply pipe is kept under pressure below atmospheric pressure, depending upon the conditions for the formation of a deposited film. In such cases, the atmosphere is also prevented from mixing into the starting material gas supply pipe, which prevents pollution due to generation of oxide inside the pipe and suppresses degradation of characteristics of a deposited film. As a consequence, occurrence of dispersion is suppressed in characteristics of a deposited film. It is also conceivable that a pressure gauge is provided in the connection part of the starting material gas supply pipe in the present invention.

Figure 5:
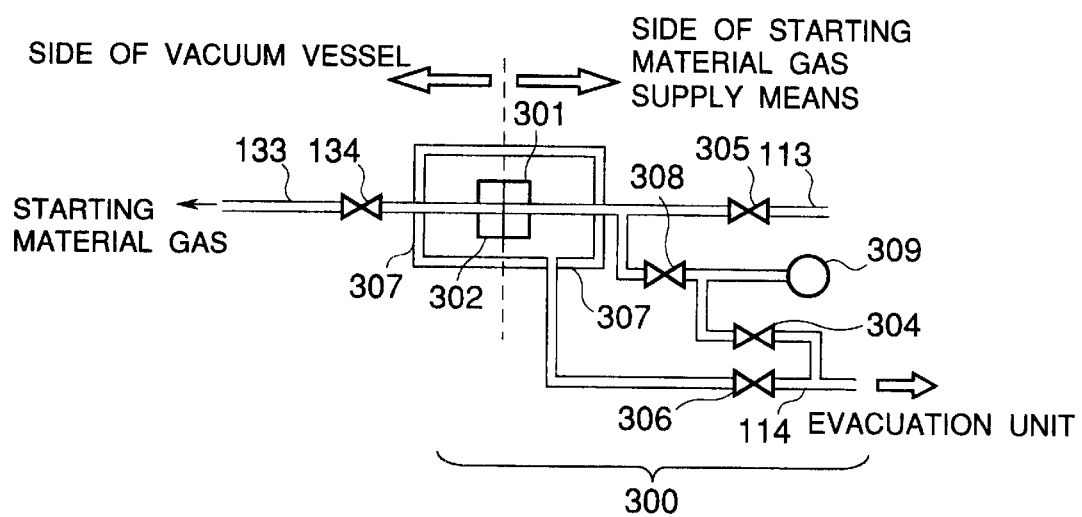

FIG. 5 is a schematic, structural drawing schematically showing an example of the connection mechanism between the vacuum vessel and the starting material gas supply pipe, provided with a pressure gauge 309.

In the apparatus of FIG. 5, valve 305 is provided in the starting material gas supply pipe and the pressure gauge 309 is connected thereto through valve 308, thereby constructing the configuration capable of measuring the seal pressure of the connection portion of the starting material gas supply pipe.

The procedures for introduction of starting material gas by use of the connection mechanism of FIG. 5 may include a procedure for measuring the seal pressure of the connection portion of the starting material gas supply pipe, in addition to the procedures for formation of deposited film in the case of the above-stated introducing mechanism of FIG. 4.

Specifically, after connection of each connection mechanism is confirmed, the valves 304, 305, 306, 308 are opened to evacuate the inside of the starting material gas introducing pipe 113 and external pipe 307. After sufficient evacuation, the valves 304 and 306 are closed, and the inert gas such as Ar or He is introduced up to before the valve 134 from the starting material gas supply unit 200 into the starting material gas supply pipe 113. Then the valve 304 is again opened to evacuate the inside.

This operation is repeated several times to perform the purge operation, and during this period the valve 306 is kept closed to seal the pipe in vacuum. Then the inside of the pipe is purged sufficiently, the inert gas is introduced up to before the valve 134 into the starting material gas supply pipe 113, the valve 305 is closed, and thereafter the seal pressure is measured inside the pipe sealed by the valves 134, 304, and 305, with the vacuum gauge 309.

During the measurement of pressure, the valve 306 is preferably opened to evacuate the inside of the external pipe 307.

After no reduction of pressure is confirmed within a predetermined time, the valve 306 is closed, and the valves 304, 305, 308 are opened to evacuate the inside of starting material gas introducing pipe 113. After that, the starting material gas, for example, SiH$_4$, CH$_4$, or B$_2$H$_6$, is introduced. If there is decrease in pressure during measurement of seal pressure, a leak exists from the portion of couplers 301, 302. Then the connection mechanism 300 is disengaged and it is checked and repaired. After that, the connection mechanism 300 is again connected, and the above operations are repeated.

The above completes the introduction of starting material gas, and then the formation of deposited film is carried out. During the formation of deposited film, the valve 306 is desirably opened to continue evacuation of the inside of external pipe 307.

For disconnecting the connection mechanism after formation of deposited film, the valve 306 is closed, and thereafter the valves 304, 305, 308 are opened to purge the inside of starting material gas supply pipe 113 and to replace the inside with the inert gas. Then the inside of external pipe 307 is made to leak by the leak mechanism (not illustrated), and the connection mechanism 300 is disengaged.

Since the connection mechanism of FIG. 5 can detect occurrence of leak in the portion of couplers 301, 302 by the measurement of seal pressure, it does not have to use the gas leak detection liquid or the like for checking the leak, which was used in the example of FIG. 1 and FIG. 2, and the all steps can be carried out by automatic control. It is also free of a risk of polluting the inside of the pipe with the gas leak detection liquid remaining therein upon disengagement of couplers.

In measuring the seal pressure inside the pipe closed by the valves 134, 304, 305, the pressure introduced into the pipe may be any pressure higher than the pressure of the pipe during actual formation of deposited film. For example, in the deposited film forming conditions in Example 1, the pressure inside the pipe is about 50 kPa, and any pressure higher than this pressure may be applied. Since the inside of external pipe 307 is evacuated to a vacuum (e.g., to the pressure of about 16 Pa in the conditions of Example 1), the leak can be checked even under the condition of the low pressure as described above.

However, the leak check is desirably carried out under the condition of 100 kPa or more for achieving the pressure measurement within a shorter time and with high accuracy.

In the pressure measurement, criteria for determination of what degree of pressure decrease should be regarded as presence of leak differ depending upon the forming conditions of deposited film and aimed characteristics. In general, pressure decrease of within 5% of the initial pressure would pose no problem in practical use.

The certainty for detecting the leak increases with longer time for measuring the seal pressure. In practice, however, times of not less than 30 seconds raised no problem in terms of the characteristics of deposited film. It is noted that the above pressure values and times differ depending upon the actual deposited film forming conditions and performance of apparatus and are not absolute conditions for carrying out the present invention.

It is also conceivable that a pipe for introduction of inert gas is provided between the valve 305 and the coupler 301, separate from the starting material gas supply pipe in the apparatus of FIG. 5.

In this case, the purge operation does not have to be conducted for the portion of starting material gas introducing pipe 113 ranging from the starting material gas introducing mechanism 200 to the valve 305, so that engagement or disengagement of the connection mechanism can be conducted efficiently.

In the present invention, the external pipe 307 of the connection mechanism 300 may be arranged to serve also as an evacuation pipe of the vacuum vessel 100.

Figure 6:
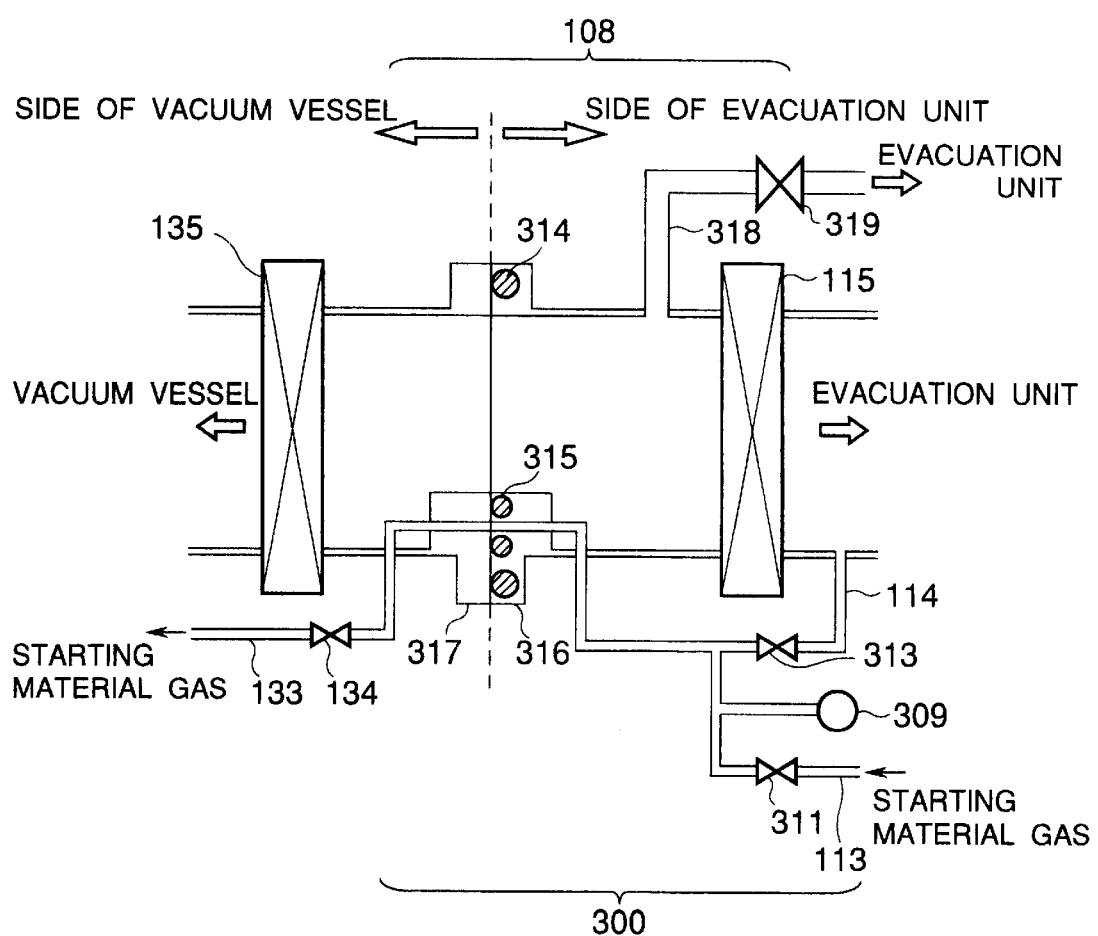

FIG. 6 is a drawing schematically showing an example of the connection mechanism in which the external pipe also serves as an evacuation pipe.

The example of FIG. 6 is constructed in a combined configuration of the connection mechanism 300 for connecting the vacuum vessel 100 to the starting material gas supply mechanism 200, with the connection mechanism 108 for connecting the vacuum vessel 100 to the second evacuation unit 103.

In FIG. 6, the vacuum vessel and second evacuation mechanism are coupled through flanges 316 and 317, they are fixed by a clamp (not illustrated), and O ring 314 is set in the flange 316.

Valve 135 and evacuation valve 115 are placed with the coupling portion of the flanges in between, thus comprising a configuration which permits the connection mechanism to be disengaged while keeping the evacuation unit and vacuum vessel in vacuum.

Pipe 318 for evacuation is in communication with a portion between the evacuation valve 115 and flange 316 through valve 319, so that the portion between the valve 135 and evacuation valve 115 can be evacuated independently. This pipe can be omitted if it is not necessitated in design of the apparatus. In that case, the inside of the connection mechanism can be evacuated by opening the evacuation valve 115.

The starting material gas supply pipe is sealed by O ring 315, through which the vacuum vessel side and the evacuation unit side (the starting material gas supply means side) are connected.

Since the O ring 315 is separated from the atmosphere by the O ring 314, the starting material gas is prevented from being discharged to the atmosphere even in the event of occurrence of leak from the O ring 315.

The following is an example of procedures for introduction of starting material gas with use of the connection mechanism of FIG. 6.

First, after connection of each connection mechanism is confirmed, the valve 319 is opened to evacuate the inside of connection mechanism 108.

At the same time, the valves 311, 313 are opened to evacuate the starting material gas supply pipe 113. After sufficient evacuation, the valve 313 is closed, and the inert gas such as Ar or He is introduced up to before the valve 134 from the starting material gas supply unit 200 into the starting material gas supply pipe 113. Then the valve 313 is again opened to evacuate the inside.

This operation is repeated several times to perform the purge operation, and during this period the valve 319 is opened to evacuate the inside of the connection mechanism 108.

After sufficient purge, the inert gas is introduced up to before the valve 134 into the starting material gas supply pipe 113, and thereafter the valve 311 is closed. Then the seal pressure in the pipe sealed by the valves 134, 311, and 313 is measured by the pressure gauge 309.

During the measurement of pressure, the valve 319 is preferably opened to evacuate the inside of the connection mechanism 108.

If no decrease of pressure is recognized within the predetermined time, the valves 311, 313 are opened to evacuate the inside of the starting material gas introducing pipe 113, and thereafter the starting material gas, for example, SiH$_4$, CH$_4$, or B$_2$H$_6$, is introduced.

The above completes the introduction of starting material gas, and then the formation of deposited film is carried out. During the formation of deposited film, the valve 319 is closed, and the evacuation valve 115 is opened to effect evacuation.

For disconnecting the connection mechanism after the formation of deposited film, the valve 134 is closed, and thereafter the valves 311, 313 are opened to purge the inside of starting material gas supply pipe 113 and to replace the inside with the inert gas. After that, the inside of the connection mechanism 108 is made to leak by the leak mechanism (not illustrated), and the connection mechanism 108 (300) is disengaged.

When the connection mechanism as shown in FIG. 6 is used as described above, it can simplify the apparatus configuration and the procedures for introduction of starting material gas and for disengagement of the connection mechanism.

The specific examples of the deposited film forming apparatus according to the present invention were described above, and the present invention will be further described with examples thereof. It is, however, noted that the present invention is by no means intended to be limited to these examples.

Experiment Example 1

An amorphous silicon deposited film was formed according to the aforementioned procedures under the conditions of Table 1 by use of the deposited film forming apparatus of the present invention shown in FIGS. 1 to 3. In this example, an aluminum cylinder of the cylindrical shape having the length 357 mm and the diameter 108 mm was used as a conductive substrate. The vacuum vessel used in this example was preliminarily designed so as to match this substrate. The frequency of the high-frequency power supplied was 105 MHz.

TABLE 1

| | |
|---|---|
| Starting material gas flow rate SiH$_4$ (sccm) | 300 |
| Substrate temperature (° C.) | 120 |
| Internal pressure (Pa) | 50 |
| High-frequency power (W) | 500 |

With the deposited film thus produced, thicknesses of deposited film were measured at seventeen points in total at intervals of 2 cm along the direction of the generating line from the center of the substrate. A ratio of the maximum thickness value to the minimum thickness value among them was evaluated as nonuniformity of thickness.

Experiment Example 2

An amorphous silicon deposited film was formed according to the aforementioned procedures under the conditions of Table 2 by use of the deposited film forming apparatus of the present invention shown in FIGS. 1 to 3. In this example, an aluminum cylinder of the cylindrical shape having the length 357 mm and the diameter 60 mm was used as a conductive substrate. The vacuum vessel used in this experiment example was preliminarily designed so as to match this substrate, and it was different in placement of the starting material gas introducing pipes and exhaust ports and in the diameter of cathode from the vacuum vessel used in Experiment Example 1.

TABLE 2

| | |
|---|---|
| Staring material gas flow rate SiH$_4$ (sccm) | 230 |
| Substrate temperature (° C.) | 120 |
| Internal pressure (Pa) | 50 |
| High-frequency power (W) | 500 |

With the deposited film thus produced, thicknesses of deposited film were measured at seventeen points in total at intervals of 2 cm along the direction of the generating line from the center of the substrate in the same manner as in Experiment Example 1. A ratio of the maximum thickness value to the minimum thickness value among them was evaluated as nonuniformity of thickness.

Comparative Experiment Example 1

An amorphous silicon deposited film was formed under the conditions shown in Table 1 and according to the aforementioned procedures, using the vacuum vessel used in Experiment Example 1 and using the cylindrical, conductive substrate (the length 357 mm, the diameter 60 mm) used in Experiment Example 2. With the deposited film thus produced, thicknesses of deposited film were measured at seventeen points in total at intervals of the 2 cm along the direction of the generating line from the center of the substrate in the same manner as in Experiment Example 1. A ratio of the maximum thickness value to the minimum thickness value among them was evaluated as nonuniformity of thickness.

Comparative Experiment Example 2

An amorphous silicon deposited film was formed under the conditions shown in Table 1 and according to the aforementioned procedures, using the vacuum vessel used in Experiment Example 2 and using the cylindrical, conductive substrate (the length 357 mm, the diameter 108 mm) used in Experiment Example 1. With the deposited film thus produced, thicknesses of deposited film. were measured at seventeen points in total at intervals of 2 cm along the direction of the generating line from the center of the substrate in the same manner as in Experiment Example 1. A ratio of the maximum thickness value to the minimum thickness value among them was evaluated as nonuniformity of thickness.

The results of Experiment Examples 1, 2 and Comparative Experiment Examples 1, 2 described above are shown in Table 3. In Table 3, the nonuniformity of thickness is relatively evaluated, with the result of Experiment Example 1 being set to be 1.

TABLE 3

|  | Experiment Example 1 | Experiment Example 2 | Comparative Experiment Example 1 | Comparative Experiment Example 2 |
| --- | --- | --- | --- | --- |
| Nonuniformity of thickness | 1 | 1.06 | 1.18 | 1.23 |

As apparent from the results of Table 3, the nonuniformity of thickness becomes worse with change in the diameter of the conductive substrate and without modification of the vacuum vessel. With the vacuum vessels designed so as to match the diameters of the conductive substrate, good results of nonuniformity of thickness, equivalent to each other, were obtained for each of the diameters.

EXAMPLE 1

An amorphous silicon photosensitive member for electrophotography was made according to the aforementioned procedures and under the conditions of Table 4 by use of the deposited film forming apparatus of the present invention shown in FIGS. 1 to 3. In the present example, an aluminum cylinder of the cylindrical shape having the length 357 mm and the diameter 30 mm was used as a conductive substrate. The vacuum vessel used in the present example was the one preliminarily designed so as to match this substrate.

TABLE 4

| Layer structure | Charge injection preventing layer | Photoconductive layer | Surface layer |
| --- | --- | --- | --- |
| Starting material gas flow rate |  |  |  |
| $SiH_4$ (sccm) | 250 | 250 | 20 |
| $B_2H_6$ (ppm) (vs $SiH_4$) | 1000 | 0.2 |  |
| $CH_4$ (sccm) |  |  | 200 |
| Substrate temperature (° C.) | 210 | 210 | 210 |
| Internal pressure (Pa) | 30 | 45 | 25 |
| High-frequency power (W) | 600 | 800 | 500 |
| Thickness ($\mu$m) | 3 | 20 | 0.5 |

The "thicknesses" in above Table 4 are approximate indices in designing the light-receiving member for electrophotography.

Twenty lots of photosensitive members for electrophotography were produced under the above conditions, and chargeability was measured for each of the photosensitive members for electrophotography. The chargeability was measured in the following manner:

Each photosensitive member for electrophotography produced was set in an electrophotographic apparatus modified for experiments from GP55 available from CANON Inc., the voltage of 6 kV was applied to a charger thereof to effect corona charging, and dark potentials were measured by a surface potential meter.

EXAMPLE 2

An amorphous silicon photosensitive member for electrophotography was made according to the aforementioned procedures and under the conditions of Table 4 by use of the deposited film forming apparatus of the present invention shown in FIGS. 1 and 2 and the connection mechanism shown in FIG. 4. In the present example, the aluminum cylinder of the cylindrical shape having the length 357 mm and the diameter 30 mm was used as a conductive substrate. The vacuum vessel used in the present example was the one preliminarily designed so as to match this substrate.

Twenty lots of photosensitive members for electrophotography were produced under the above conditions, and chargeability was measured for each of the photosensitive members for electrophotography.

EXAMPLE 3

An amorphous silicon photosensitive member for electrophotography was made according to the aforementioned procedures and under the conditions of Table 4 by use of the deposited film forming apparatus of the present invention shown in FIGS. 1 and 2 and the connection mechanism shown in FIG. 5. In the present example, the aluminum cylinder in the cylindrical shape having the length 357 mm and the diameter 30 mm was used as a conductive substrate. The vacuum vessel used in the present example was the one preliminarily designed so as to match this substrate.

Twenty lots of photosensitive members for electrophotography were produced under the above conditions, and chargeability was measured for each of the photosensitive members for electrophotography.

EXAMPLE 4

An amorphous silicon photosensitive member for electrophotography was made according to the aforementioned procedures and under the conditions of Table 4 by use of the deposited film forming apparatus of the present invention shown in FIGS. 1 and 2 and the connection mechanism shown in FIG. 6. In the present example, the aluminum cylinder in the cylindrical shape having the length 357 mm and the diameter 30 mm was used as a conductive substrate. The vacuum vessel used in the present example was the one preliminarily designed so as to match this substrate.

Twenty lots of photosensitive members for electrophotography were produced under the above conditions, and chargeability was measured for each of the photosensitive members for electrophotography.

The chargeability is evaluated according to the following criteria:

A: There is little dispersion of chargeability, and thus the results are very good.

B: There is dispersion of chargeability, but the overall results are within the specifications of the electrophotographic apparatus.

C: There is dispersion of chargeability, and some of the results do not satisfy the specifications.

TABLE 5

|  | Example 1 | Example 2 | Example 3 | Example 4 |
|---|---|---|---|---|
| Chargeability | B | B | A | A |

From the results of Table 5, the dispersion of chargeability is slightly greater in Examples 1 and 2. It is presumed that the gas leak detection liquid used in the leak check intruded into the pipe upon disengagement of the couplers and affected the characteristics. However, the dispersion is small in both Examples 1 and 2 and the good results were achieved in either case by the deposited film forming apparatus of the present invention.

In the present invention, as described above, the vacuum vessel is freely movable, and thus the deposited film forming means does not have to be modified even in the production of many types and low volume, by preliminarily preparing the vacuum vessels optimum for production of desired amorphous silicon devices. The present invention can minimize the dead time of the production apparatus, without lowering the operation rates of the starting material gas supply means and evacuation system requiring big investments for facilities and the other incidental facilities.

Since optimum vacuum vessel configuration can be selected so as to match the production of individual amorphous silicon devices, high-quality devices can be provided on a stable basis.

Further, since the vacuum vessel can be moved while maintaining in vacuum, maintenance of a vacuum vessel can be carried out at a position separate from the evacuation means with use of a plurality of vacuum vessels, and during that period, formation of deposited film can be carried out with another vacuum vessel. From this point, the dead time of a deposited film forming apparatus can also be minimized, and high-quality devices can be supplied on a stable basis.

What is claimed is:

1. A vacuum processing apparatus comprising:
a vacuum vessel capable of holding a substrate therein;
evacuation means for evacuating the vacuum vessel;
gas supply means for introducing a gas into the vacuum vessel;
a high-frequency power source for applying high-frequency power to at least one electrode, thereby generating a plasma; and
a plurality of connection mechanisms capable of detachably connecting the vacuum vessel to each of the evacuation means, the high-frequency power source, and the gas supply means;
wherein the evacuation means comprise a first evacuation means for evacuating the vacuum vessel from atmospheric pressure to a vacuum and a second evacuation means for evacuating the inside of the vacuum vessel during generation of the plasma; and
wherein the vacuum vessel is capable of being moved between the first and second evacuation means while maintaining vacuum.

2. The vacuum processing apparatus according to claim 1, wherein the connection mechanism between the vacuum vessel and the gas supply means comprises a supply pipe for supplying starting material gas and an external pipe for separating the supply pipe from the atmosphere and wherein the interior of the external pipe can be evacuated.

3. The vacuum processing apparatus according to claim 2, wherein the external pipe is a pipe for detachably connecting the vacuum vessel to the evacuation means.

4. The vacuum processing apparatus according to claim 2, wherein the connection portion of the pipe for supply of gas comprises valves capable of sealing the connection portion before and after the connection portion and a pressure gauge for measuring a pressure inside the pipe for supply of gas between the valves.

5. The vacuum processing apparatus according to claim 1, wherein the electrode to which the high-frequency power is applied forms a part of the vacuum vessel.

6. The vacuum processing apparatus according to claim 1, wherein the at least one electrode has a shape similar to a substrate surface to be processed.

7. The vacuum processing apparatus according to claim 1, wherein the gas supply means and the connection mechanism between the vacuum vessel and the evacuation means are connected.

8. The vacuum processing apparatus according to claim 7, wherein a connection part of the gas supply means is provided inside a pipe of the evacuation means.

9. The vacuum processing apparatus according to claim 1, further comprising a matching box provided between the vacuum vessel and a connection mechanism for connection to the high-frequency power source.

10. The vacuum processing apparatus according to claim 1, wherein the vacuum processing apparatus is a production apparatus for an electrophotographic amorphous silicon photosensitive member.

11. A vacuum processing method for evacuating the inside of a vacuum vessel provided with a substrate therein, by evacuation means, introducing a gas into the vacuum vessel by gas supply means and applying high-frequency power thereto by a high-frequency power source, thereby generating a plasma, wherein the evacuation means comprises a first evacuation means and a second evacuation means, comprising the steps of:
connecting the vacuum vessel to the first evacuation means to evacuate the vacuum vessel to a vacuum;
disengaging and moving the vacuum vessel from the first evacuation means while maintaining a vacuum in the vacuum vessel;
connecting the vacuum vessel with the second evacuation means for evacuating the inside of the vacuum vessel, the starting material gas supply means, and the high-frequency power source; and disconnecting the vacuum vessel from the second evacuation means, the gas supply means, and the high-frequency power source.

12. The vacuum processing method according to claim 11, further comprising a step of, in connecting the vacuum vessel with the gas supply means, replacing the atmosphere inside of a gas supply pipe through which a gas flows with an inert gas and thereafter measuring a seal pressure of a connection portion.

13. The vacuum processing method according to claim 11, further comprising a step of, during generation of the plasma with the vacuum vessel being connected to the second evacuation means, gas supply means, and high-frequency power source, connecting another vacuum vessel to the first evacuation means and setting a substrate in or evacuating the another vacuum vessel.

14. The vacuum processing method according to claim 11, further comprising a step of checking a leak of a connection part to the gas supply means.

15. The vacuum processing method according to claim 11, further comprising a step of providing an external pipe for covering a connection part to the gas supply means and evacuating the inside of the external pipe to a vacuum.

16. The vacuum processing method according to claim 15, further comprising a step of introducing an inert gas into the external pipe prior to evacuating the inside of the external pipe.

17. The vacuum processing method according to claim 15, further comprising a step of causing the external pipe to leak prior to disconnecting the connection part.

18. The vacuum processing method according to claim 11, wherein the plasma is utilized for formation of a deposited film.

19. The vacuum processing method according to claim 11, wherein the gas comprises a starting material gas used for formation of a deposited film, the starting material gas containing component atoms of the deposited film to be formed.

20. The vacuum processing method according to claim 11, further comprising a step of connecting a matching box to output from the high-frequency power source.

21. The vacuum processing method according to claim 11, wherein the vacuum processing method is a production method for an electrophotographic amorphous silicon photosensitive member.

22. A vacuum processing apparatus comprising:

a vacuum vessel capable of holding a substrate therein;

evacuation means for evacuating the vacuum vessel;

gas supply means for introducing a gas into the vacuum vessel;

a high-frequency power source for applying high frequency power to at least one electrode, thereby generating a plasma; and a plurality of connection mechanisms capable of detachably connecting the vacuum vessel to each of the evacuation means, the high frequency power sources and the gas supply means;

wherein the connection mechanism between the vacuum vessel and the gas supply means comprises a supply pipe for supplying starting material gas and an external pipe for separating the supply pipe from the atmosphere and wherein the interior of the external pipe can be evacuated.

23. The vacuum processing apparatus according to claim 22, further comprising a matching box provided between the vacuum vessel and a connection mechanism for connection to the high-frequency power source.

24. The vacuum processing apparatus according to claim 22, wherein the vacuum processing apparatus is a production apparatus for an electrophotographic amorphous silicon photosensitive member.

25. A vacuum processing apparatus comprising:

a vacuum vessel provided with a substrate therein;

evacuation means for evacuating the vacuum vessel;

gas supply means for introducing a gas into the vacuum vessel;

high frequency power supply means for generating plasma; and a plurality of connection mechanisms capable of detachably connecting the vacuum vessel to each of the evacuation means, the gas supply means and the high frequency power supply means;

wherein the connection mechanism for connecting the vacuum vessel to the evacuation means and the connection mechanism for connecting the gas supply means are integrally formed;

wherein the connection mechanism for connecting the vacuum vessel to the gas supply means is formed in an evacuation pipe which evacuates the vacuum vessel and which is formed by the connection mechanism for connecting the vacuum vessel to the evacuation means;

wherein the evacuation means comprises a first evacuation means and a second evacuation means; and wherein the vacuum vessel is capable of being moved between the first and second evacuation means while maintaining vacuum.

26. The vacuum processing apparatus according to claim 25, further comprising a matching box provided between the vacuum vessel and a connection mechanism for connection to the high frequency power supply means.

27. The vacuum processing apparatus according to claim 25, wherein the vacuum processing apparatus is a production apparatus for an electrophotographic amorphous silicon photosensitive member.

* * * * *

UNITED STATES PATENT AND TRADEMARK OFFICE
CERTIFICATE OF CORRECTION

PATENT NO. : 6,440,504 B1
DATED : August 27, 2002
INVENTOR(S) : Kazuyoshi Akiyama It is certified that error appears in the above-identified patent and that said Letters Patent is hereby corrected as shown below:

<u>Column 1,</u>
Line 51, "circumstances" should read -- circumstances, --.

<u>Column 2,</u>
Line 30, "deposited" should read -- a deposited --.

<u>Column 5,</u>
Line 60, "introduction" should read -- introducing --.

<u>Column 7,</u>
Line 48, "modified" should read -- modified, --; and
Line 58, "way" should read -- way, --.

<u>Column 9,</u>
Line 54, "disengaged" should read -- disengaged, --; and
Line 59, "deposited" should read -- a deposited --.

<u>Column 10,</u>
Line 8, " the all" should read -- all the --.

<u>Column 15,</u>
Line 48, "configuration" should read -- configurations --; and
Line 53, "in" should be deleted.

UNITED STATES PATENT AND TRADEMARK OFFICE
CERTIFICATE OF CORRECTION

PATENT NO. : 6,440,504 B1
DATED : August 27, 2002
INVENTOR(S) : Kazuyoshi Akiyama It is certified that error appears in the above-identified patent and that said Letters Patent is hereby corrected as shown below:

<u>Column 18,</u>
Line 3, "high frequency power sources" should read -- high-frequency power source --;
Lines 24 and 28, "high frequency" should read -- high-frequency --; and
Line 47, "high frequency" should read -- high-frequency --.

Signed and Sealed this

Seventeenth Day of June, 2003

JAMES E. ROGAN
*Director of the United States Patent and Trademark Office*